(12) United States Patent
Beak et al.

(10) Patent No.: US 10,446,631 B2
(45) Date of Patent: Oct. 15, 2019

(54) ORGANIC LIGHT EMITTING DISPLAY DEVICE WITH IMPROVED APERTURE RATIO AND METHOD FOR MANUFACTURING THE SAME

(71) Applicant: LG Display Co., Ltd., Seoul (KR)

(72) Inventors: Jung-Sun Beak, Paju-si (KR); Jeong-Oh Kim, Goyang-si (KR); Jong-Won Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/799,773

(22) Filed: Oct. 31, 2017

(65) Prior Publication Data

US 2018/0122883 A1 May 3, 2018

(30) Foreign Application Priority Data

Oct. 31, 2016 (KR) .................. 10-2016-0143984

(51) Int. Cl.
| | |
|---|---|
| H01L 27/32 | (2006.01) |
| H01L 51/00 | (2006.01) |
| H01L 51/56 | (2006.01) |
| H01L 27/12 | (2006.01) |
| H01L 29/08 | (2006.01) |

(Continued)

(52) U.S. Cl.
CPC ...... H01L 27/3262 (2013.01); H01L 27/3248 (2013.01); H01L 27/3258 (2013.01); H01L 27/3276 (2013.01); H01L 51/0096 (2013.01); H01L 51/56 (2013.01); *H01L 27/124* (2013.01); *H01L 27/1248* (2013.01); *H01L 27/1255* (2013.01); *H01L 27/1262* (2013.01); *H01L 27/322* (2013.01); *H01L 27/3213* (2013.01); *H01L 27/3265* (2013.01); *H01L 29/45* (2013.01); *H01L 2227/323* (2013.01)

(58) Field of Classification Search
CPC .. H01L 27/3248; H01L 29/45; H01L 27/3265
See application file for complete search history.

(56) References Cited

U.S. PATENT DOCUMENTS

2001/0052952 A1* 12/2001 Choo ................ G02F 1/133555
  349/43
2007/0131936 A1* 6/2007 Kang .................... G02F 1/1354
  257/72

(Continued)

FOREIGN PATENT DOCUMENTS

| KR | 20090120093 | 11/2009 |
|---|---|---|
| KR | 20150020502 | 2/2015 |

OTHER PUBLICATIONS

Office Action for Korean Patent Application No. KR 2016-0143984, dated Sep. 28, 2017, 6 Pages, (With Concise Explanation of Relevance).

*Primary Examiner* — Nduka E Ojeh
(74) *Attorney, Agent, or Firm* — Fenwick & West LLP

(57) ABSTRACT

Disclosed are an organic light emitting display device to improve an aperture ratio, and a method of manufacturing the same. The organic light emitting display device includes a plurality of contact holes overlapping an anode of an organic light emitting element in each sub-pixel region, wherein conductive films connected through at least one of the contact holes are transparent, thus allowing regions, where the contact holes are formed, to be used as light emitting regions, thereby improving an aperture ratio.

20 Claims, 12 Drawing Sheets

(51) Int. Cl.
*H01L 35/24* (2006.01)
*H01L 29/45* (2006.01)

(56) References Cited

U.S. PATENT DOCUMENTS

| | | | |
|---|---|---|---|
| 2015/0144910 A1* | 5/2015 | Beak | H01L 27/124 257/40 |
| 2015/0188083 A1* | 7/2015 | Jang | H01L 27/124 257/40 |
| 2017/0186826 A1* | 6/2017 | Nam | H01L 27/322 |
| 2018/0151120 A1* | 5/2018 | Kim | G09G 3/3258 |

* cited by examiner

ORGANIC LIGHT EMITTING DISPLAY DEVICE WITH IMPROVED APERTURE RATIO AND METHOD FOR MANUFACTURING THE SAME

CROSS-REFERENCE TO RELATED APPLICATIONS

This application claims priority to Republic of Korea Patent Application No. 10-2016-0143984, filed on Oct. 31, 2016, which is hereby incorporated by reference as if fully set forth herein.

BACKGROUND

Field

The present disclosure relates to an organic light emitting display device and a method of manufacturing the same. More particularly, the present disclosure relates to an organic light emitting display device to improve an aperture ratio and a method of manufacturing the same.

Discussion of the Related Art

Image display devices for displaying a variety of information on a screen are significant technologies in the information-technology era, which are being developed into slimmer, lighter, more portable, and higher-functional forms. In response to these requirements, organic light emitting displays that display an image by controlling the amount of light emitted by an organic light emitting layer attract a great deal of attention as flat panel display devices capable of reducing the weight and volume, which are drawbacks of cathode ray tubes. Organic light emitting displays (OLEDs), which spontaneously emit light, have low consumption power, rapid response speed, high luminous efficacy, high brightness, and wide viewing angle.

Organic light emitting displays display an image through a plurality of pixels disposed in the form of a matrix. Each pixel includes a light emitting element and a pixel circuit which independently operates the light emitting element and includes a plurality of transistors.

For the organic light emitting display, light generated by the light emitting element can be emitted to the rear surface of a substrate in a region where the pixel circuit is disposed. A plurality of conductive layers included in the pixel circuit are made of an opaque material, thus preventing light generated by the light emitting element from being emitted externally. Accordingly, conventional organic light emitting displays have an aperture ratio which decreases in proportion to the area occupied by the pixel circuit. In addition, recently, a compensation circuit is required for each sub-pixel region, thus disadvantageously making it difficult to secure an appropriate aperture ratio.

SUMMARY

Accordingly, the present disclosure is directed to an organic light emitting display device and a method of manufacturing the same that substantially obviate one or more problems due to limitations and disadvantages of the related art.

An object of the present disclosure is to provide an organic light emitting display device to improve an aperture ratio and a method of manufacturing the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, provided are an organic light emitting display device which includes a plurality of contact holes overlapping an anode of an organic light emitting element in each sub-pixel region wherein conductive films connected through at least one of the contact holes are transparent, thus allowing regions, where the contact holes are formed, to be used as light emitting regions, thereby improving an aperture ratio, and a method of manufacturing the same.

Embodiments also relate to a display device including a transparent substrate and a plurality of pixels on the substrate. Each pixel includes a light emitting element on the substrate, and a first thin film transistor (TFT) on the substrate. The first TFT includes an active layer and a first electrode electrically connected to the active layer. The first electrode includes a first conductive layer formed of transparent conductive material, and including a first portion and a second portion. The first electrode also includes a second conductive layer contacting the first portion of the first conductive layer. The second portion of the first conductive layer is disposed below the light emitting element, and does not contact the second conductive layer.

Embodiments also relate to a method of manufacturing a display device. An active layer of a first thin film transistor (TFT) is formed on the substrate. A first electrode of the first TFT electrically connected to the active layer is formed. The first electrode includes a first conductive layer formed of transparent conductive material, and includes a second conductive layer that contacts a first portion of the first conductive layer. A light emitting element is formed on the substrate. The second portion of the first conductive layer is disposed below the light emitting element, and does not contact the second conductive layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings.

Figure 1:
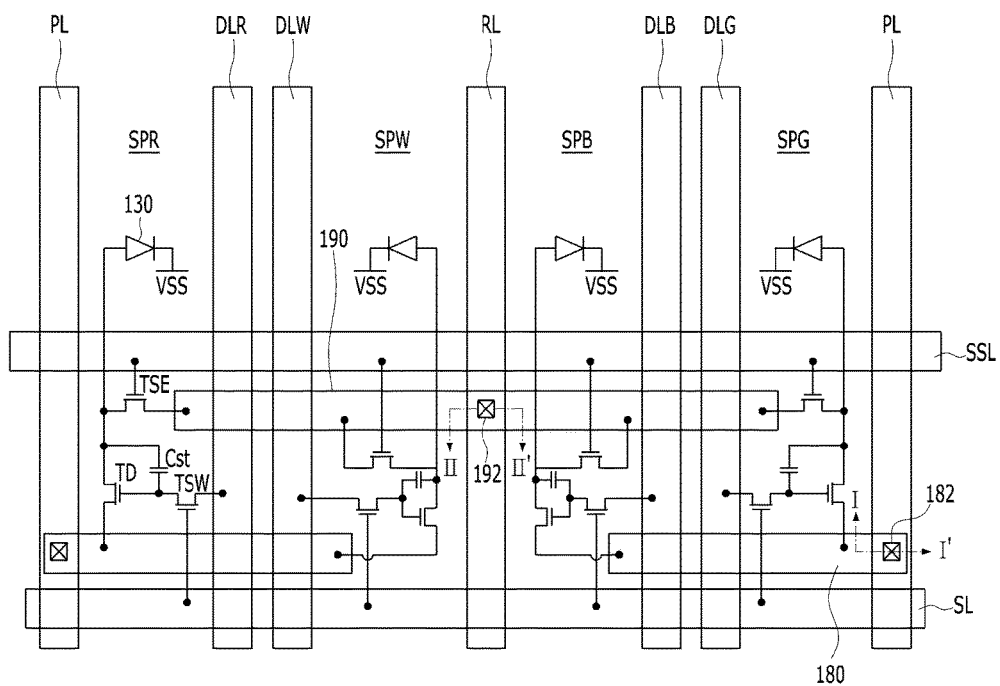
FIG. 1 is a plan view illustrating an organic light emitting display device according to an embodiment of the present disclosure.

FIG. 1 is a plan view illustrating an organic light emitting display device according to an embodiment of the present disclosure.

The organic light emitting display device according to the present disclosure shown in FIG. 1 includes a plurality of sub-pixel regions SPR, SPG, SPB, and SPW formed by intersections between scan lines SL, sensing control lines SSL, data lines DL, power supply lines PL, and reference lines RL.

The sub-pixel regions include a red sub-pixel region SPR, a green sub-pixel region SPG, a blue sub-pixel region SPB, and a white sub-pixel region SPW. Although FIG. 1 shows that the red sub-pixel region SPR, the white sub-pixel region SPW, the green sub-pixel region SPG, and the blue sub-pixel region SPB are disposed in this order, the disposition order thereof is highly varied in each unit pixel and changes depending on color and configuration. According to the present disclosure, in addition to the red, green, and blue sub-pixel regions SPR, SPG, and SPB, the white sub-pixel region SPW with a high transmission is further provided in order to improve luminous efficacy.

Each of the red, green, blue, and white sub-pixel regions SPR, SPG, SPB, and SPW includes a light emitting element 130 and a pixel driving circuit to independently operate the light emitting element 130. The pixel driving circuit includes a switching thin film transistor TSW, a driving thin film transistor TD, a sensing thin film transistor TSE, and a storage capacitor Cst.

When a sensing pulse is supplied to the sensing control line SSL, the sensing thin film transistor TSE is turned on and detects a threshold voltage of the driving thin film transistor TD and a threshold voltage of the light emitting element 130. That is, when the sensing thin film transistor TSE is turned on, a current pass to the sensing thin film transistor TSE and the reference line RL is created. A data driver (not shown) or a timing controller (not shown) detects a current flowing through the current pass, thereby detecting the threshold voltage of the driving thin film transistor TD and the threshold voltage of the light emitting element 130. Based on the detected threshold voltage, a data voltage is compensated and the compensated data voltage is supplied to data lines DLR, DLG, DLB, and DLW. For this purpose, the sensing thin film transistor TSE includes a gate electrode connected to the sensing control line SSL, a source electrode connected to the reference line RL, and a drain electrode connected to the driving thin film transistor TD. The reference line RL is connected through a second jumping line 190 protruding from the reference line RL to the source electrodes of the sensing thin film transistors TSE in the red, green, blue, and white sub-pixel regions SPR, SPG, SPB, and SPW. The reference line RL is interposed between the white and blue sub-pixel regions SPW and SPB rendering different colors, to prevent color mixing between the white and blue sub-pixels SPW and SPB.

Figure 2:
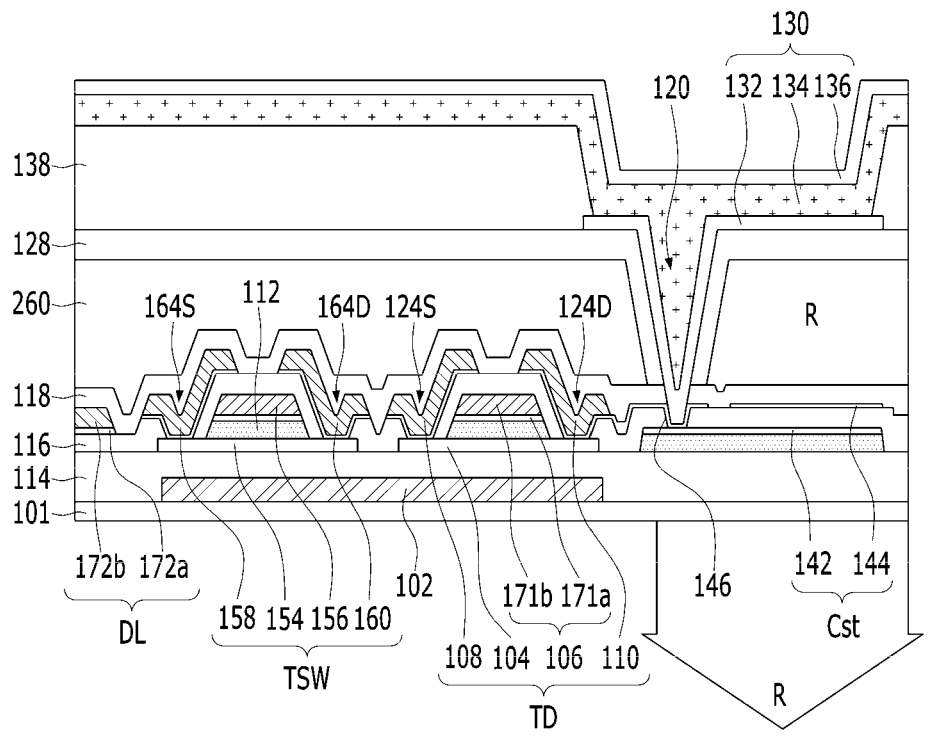
FIG. 2 is a sectional view illustrating the organic light emitting display device according to an embodiment of the present disclosure.
Figure 2:
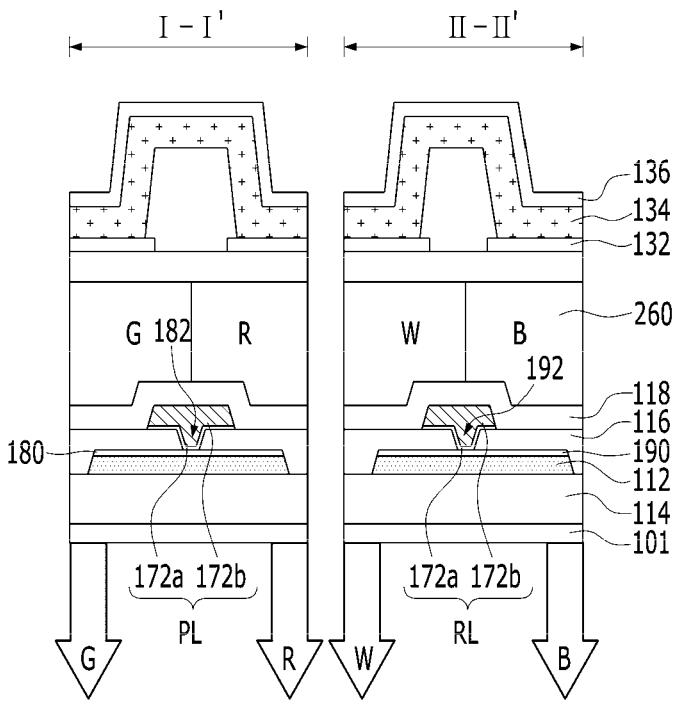

When a scan pulse is supplied to the scan line SL, the switching thin film transistor TSW is turned on and detects the data signal from the data lines DLR, DLG, DLB, and DLW to the storage capacitor Cst and the gate electrode 106 of the driving thin film transistor TD. As shown in FIG. 2, the switching thin film transistor 150 includes a first gate electrode 156 connected to the scan line SL, a first source electrode 158 connected to the data line DL, a first drain electrode 160 connected to the second gate electrode 106, and a first active layer 154.

The driving thin film transistor TD controls the current supplied from the power supply line PL according to the driving voltage charged in the storage capacitor Cst, and supplies the current in proportion to the driving voltage to the light emitting element 130, so the light emitting element 130 can emit light. The driving thin film transistor TD includes a second gate electrode 106 connected to the first drain electrode 160, a second source electrode 108 connected to the power supply line PL, a second drain electrode 110 connected to the light emitting element 130, and a second active layer 104. Here, the power supply line PL is connected through a first jumping line 180 protruding from the power supply line PL to the second source electrodes 108 of the driving thin film transistors TD of the red, green, blue, and white sub-pixel regions SPR, SPG, SPB, and SPW. The power supply line PL is interposed between the green and red sub-pixel regions SPG and SPR rendering different colors, to prevent color mixing between the green and red sub-pixels SPG and SPR.

Meanwhile, the first and second gate electrodes 156 and 106 of the switching thin film transistor TSW and the driving thin film transistor TD overlap with the first and second active layers 154 and 104, respectively, with the gate insulation pattern 112 interposed therebetween.

The first active layer 154 overlaps with the first gate electrode 156 disposed on the gate insulation pattern 112 to form a channel between the first source electrode 158 and the first drain electrode 160. The second active layer 104 overlaps with the second gate electrode 106 disposed on the gate insulation pattern 112 to form a channel between the second source electrode 108 and the second drain electrode 110. Each of the first and second active layers 154 and 104 is formed of an oxide semiconductor which includes at least one metal selected from Zn, Cd, Ga, In, Sn, Hf, and Zr, or polycrystalline silicon or amorphous silicon.

The first and second source electrodes 158 and 108 are respectively connected to first and second active layers 154 and 104 through first and second source contact holes 164S and 124S penetrating through the interlayer insulation film 116. The first and second drain electrodes 160 and 110 are respectively connected to first and second active layers 154 and 104 through first and second drain contact holes 164D and 124D penetrating through the interlayer insulation film 116.

The first drain electrode 160 is electrically connected through a connection electrode (not shown) to the second gate electrode 106 of the driving thin film transistor TD. The second drain electrode 110 is connected to a portion of the lower storage electrode 142 exposed through the storage contact hole 146 penetrating through the interlayer insulation film 116. The second drain electrode 110 is exposed through a pixel contact hole 120 penetrating through a protective film 118 and a planarization layer 128 and is connected to an anode 132. The second drain electrode 110 includes a second transparent conductive layer 172a in a region where the second drain electrode 110 overlaps the anode 132, and the second drain electrode 110 includes the second transparent conductive layer 172a and a second opaque conductive layer 172b stacked on the second transparent conductive layer 172a in a region where the second drain electrode 110 overlaps the second active layer 104.

The storage capacitor 140 includes a lower storage electrode 142 and an upper storage electrode 144 which overlap each other with the interlayer insulation film 116 between. In this case, the lower storage electrode 142 is formed in the form of a transparent conductive layer on the gate insulation pattern 112, and the upper storage electrode 144 is formed in the form of a transparent conductive layer on the interlayer insulation film 116. As such, the lower storage electrode 142 and the upper storage electrode 144 constituting the storage capacitor 140 are disposed as transparent conductive layers in a light emitting region, thereby improving aperture ratio.

The light emitting element 130 includes an anode 132, an organic light emitting layer 134 formed on the anode 132, and a cathode 136 formed on the organic light emitting layer 134.

The anode 132 is electrically connected to a second drain electrode 110 exposed through the pixel contact hole 120 penetrating through the protective film 118 and the planarization layer 128. Meanwhile, in the case of a bottom emission-type organic light emitting display device, the anode 132 is formed of transparent conductive oxide (TCO).

The organic light emitting layer 134 is formed by stacking a hole-related layer, a light emitting layer, and an electron-related layer in this order or a reverse order on the anode 132.

A bank 138 is formed so as to expose the anode 132 disposed in the light emitting region, as shown in FIG. 2.

The cathode 136 is formed on upper and side surfaces of the organic light emitting layer 134 and the bank 138 such that it faces the anode 132 via the organic light emitting layer 134. In the case of a bottom emission type organic light emitting display device, the cathode 136 has a structure in which a transparent conductive layer such as indium-tin-oxide (ITO) or indium-zinc-oxide (IZO), and a metal layer including aluminum (Al), silver (Ag), APC (Ag;Pb;Cu) or the like are stacked together.

Meanwhile, at least one of the first and second gate electrodes 156 and 106, the scan line SL, and the sensing control line SSL includes the first transparent conductive layer 171a and the first opaque conductive layer 171b formed on the first transparent conductive layer 171a. At least one of the lower storage electrode 142, and the first and second jumping lines 180 and 190 includes a first transparent conductive layer 171a.

In addition, at least one of the first and second source electrodes 158 and 108, the first drain electrode 160, a region of the second drain electrode 110 overlapping the second active layer 104, the data lines DLR, DLG, DLB, and DLW, the power supply line PL, and the reference line RL includes the second transparent conductive layer 172a and the second opaque conductive layer 172b formed on the second transparent conductive layer 172a.

The region of the second drain electrode 110 overlapping the anode 132, and the upper storage electrode 144 include the second transparent conductive layer 172a.

Here, the first and second transparent conductive layers 171a and 172a include a transparent conductive material such as ITO, and the first and second opaque conductive layers 171b and 172b may be a single layer or multiple layers which include any one of molybdenum (Mo), aluminum (Al), chromium (Cr), gold (Au), titanium (Ti), nickel (Ni), neodymium (Nd) and copper (Cu), or an alloy thereof, but the present disclosure is not limited thereto.

In one embodiment, a first transistor may include a first electrode (e.g., source or drain electrode) electrically connected to the active layer, in which the first electrode includes a first conductive layer (e.g., second transparent conductive layer 172a) and a second conductive layer (e.g., second opaque conductive layer 172b). The first conductive layer may be formed of transparent conductive material, and may include a first portion and a second portion. The second conductive layer may contact the first portion of the first conductive layer, and the second portion of the first conductive layer may be disposed below the light emitting element 130, and may not contact the second conductive layer. Thus, the protective film 118 disposed on the first electrode may contact a top surface of the second conductive layer, and contact a top surface of the second portion of the first conductive layer. The second portion of the first conductive layer may be disposed in an opening of the interlayer insulation film 116. In one embodiment, the second portion of the first conductive layer may contact a third conductive layer disposed below the interlayer insulation film 116 exposed through the opening. The third conductive layer may also be formed of transparent conductive material.

In one embodiment, the transistor corresponds to the driving transistor TD, and the first electrode corresponds to the drain electrode 110. In particular, the lower storage electrode 142 and the second drain electrode 110, which overlap the anode 132, are each formed as transparent conductive layers 171a and 172a in a region where the storage contact hole 146 is formed. In this case, the region where the storage contact hole 146 is formed becomes transparent, thus emitting light generated by the organic light emitting layer 134 through the region where the storage contact hole 146 is formed to the bottom of the substrate 101. The anode electrode 132 of the light emitting element 130 may contact the second portion of the second transparent conductive layer 172a of the drain electrode 110 disposed below the light emitting element 130 that does not contact the second opaque conductive layer 172b of the drain electrode 110. In addition, the second portion of the second transparent conductive layer 172a of the drain electrode 110 may contact the lower storage electrode 142 of the storage capacitor Cst. As a result, the present disclosure utilizes, as light emitting regions, the light emitting region where the anode 132 is disposed as well as the region where the storage contact hole 146 is formed, thereby improving aperture ratio. The electrodes disposed in the region where the storage contact hole 146 is formed, as well as the region corresponding to the contact hole disposed in the pixel driving circuit, are formed as the transparent conductive layer 172a.

In another embodiment, the transistor corresponds to the switching transistor TSW, and the first electrode corresponds to the first drain electrode 160. For example, electrodes disposed in the region where the contact hole to connect the first drain electrode 160 to the second gate electrode 106 is formed, are formed as the transparent conductive layer 172a, thereby improving aperture ratio. In such an embodiment, the second portion of the second transparent conductive layer 172a of the first drain electrode 160 may contact a conductive layer extending from a part of the gate electrode 106 of the driving transistor TD.

In addition, the first jumping line 180 to connect the second source electrode 108 of the driving thin film transistor TD to the power supply line PL is formed with the same pattern as the gate insulation pattern 112 on the gate insulation pattern 112. The first jumping line 180 is exposed through the first power contact hole 182 and is electrically connected to the power supply line PL. The first jumping line 180 protrudes from the power supply line PL toward the sub-pixel region parallel to the scan line SL in order to connect the power supply line PL to the second source electrode 108 of the driving thin film transistor TD. In this case, the first jumping line 180 is formed as the first transparent conductive layer 171a in the sub-pixel region. In this case, the first jumping line 180 becomes transparent, thus emitting light generated by the organic light emitting layer 134 through the first jumping line 180 to the bottom of the substrate 101. Accordingly, the present disclosure can utilize the region where the first jumping line 180 is formed in the sub-pixel region as a light emitting region, thereby improving an aperture ratio.

In addition, the second jumping line 190 to connect the source electrode of the sensing thin film transistor TSE to the reference line RL is formed in the same pattern as the gate insulation pattern 112 on the gate insulation pattern 112. The second jumping line 190 is exposed through the second power contact hole 192 and is electrically connected to the reference line RL. The second jumping line 190 protrudes from the reference line RL toward each sub-pixel region parallel to the scan line SL in order to connect the source electrode of the sensing thin film transistor TSE to the reference line RL. In this case, the second jumping line 190 is formed as the first transparent conductive layer 171a in each sub-pixel region. In this case, the second jumping line 190 becomes transparent, thus emitting light generated by the organic light emitting layer 134 through the second jumping line 190 to the bottom of a substrate 101. Accordingly, the present disclosure can utilize the region where the second jumping line 190 is formed in the sub-pixel region as a light emitting region, thereby improving an aperture ratio.

In other words, a conductive line (e.g., PL or RL) may extend on the substrate in a first direction. A jumping line (e.g., 180 or 190) formed of transparent conductive material electrically connected to the conductive line may extend in a second direction different from the first direction on the substrate. The jumping line may be formed in a same layer as a gate electrode of a driving transistor TD or a switching transistor TSW. For example, the jumping line may be formed in the same layer as the transparent conductive layer 171a.

Figure 3:
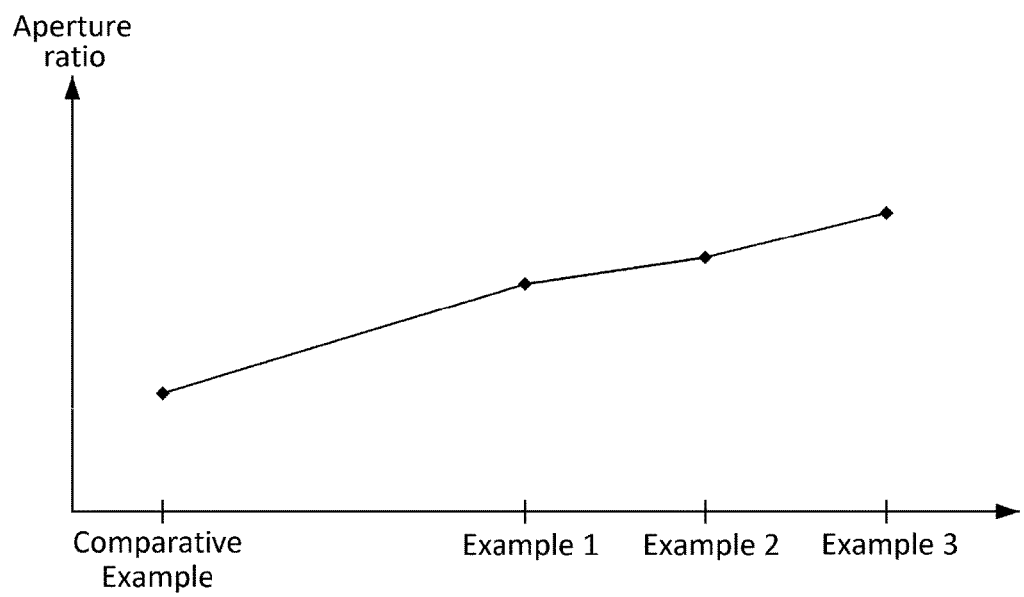
FIG. 3 shows aperture ratios of organic light emitting display devices according to Comparative Example and Example of the present disclosure.

FIG. 3 shows aperture ratios of organic light emitting display devices according to Comparative Example and Example according to the present disclosure.

In FIG. 3, Example 1 relates to an organic light emitting display in which the region of the storage contact hole 146 is also transparent, because the lower storage electrode 142 formed as the first transparent conductive layer 171a is connected to the second drain electrode 110 formed as the second transparent conductive layer 172a through the storage contact hole 146. Example 2 relates to an organic light emitting display in which the region of the storage contact hole 146 as well as the first jumping line 180 are transparent. Example 3 relates to an organic light emitting display device in which the region of the storage contact hole 146, and the first and second jumping lines 180 and 190 are transparent. Comparative Example relates to a conventional organic light emitting display device in which the storage contact hole region and the first and second jumping lines are opaque.

As can be seen from FIG. 3, Examples 1 to 3 exhibit better aperture ratio than Comparative Example. In particular, Example 3, where regions of the storage contact hole 146, and the first and second jumping lines 180 and 190 are transparent, exhibits a 7% increase in aperture ratio as compared to the convention organic light emitting display device of the Comparative Example, where the storage contact hole region, and first and second jumping lines are opaque.

FIGS. 4A to 4I are sectional views illustrating a method of manufacturing the organic light emitting display device shown in FIG. 2 according to an embodiment of the present disclosure.

Figure 4A:
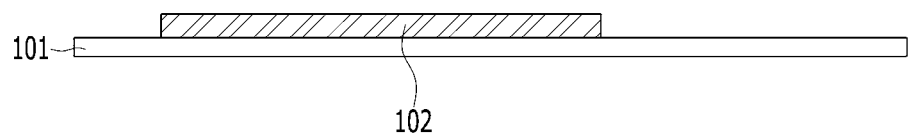
FIGS. 4A to 4I are sectional views illustrating a method of manufacturing the organic light emitting display device shown in FIG. 2 according to an embodiment of the present disclosure.
Figure 4A:
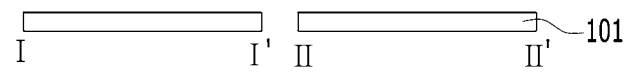

Referring to FIG. 4A, a light-shielding layer 102 is formed on a substrate 101.

More specifically, the light-shielding layer 102 is formed by depositing a light-shielding material over the entire surface of the substrate 101 and patterning the light-shielding material by photolithography and etching processes.

Figure 4B:
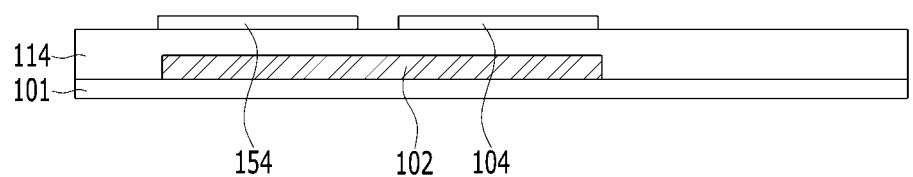
Figure 4B:
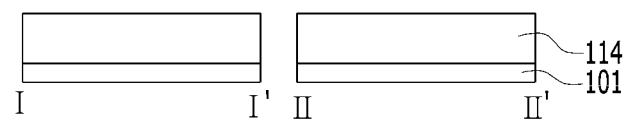

Referring to FIG. 4B, a buffer film 114 is formed on the substrate 101 provided with the light-shielding layer 102, and first and second active layers 154 and 104 are formed on the buffer film 114.

More specifically, the buffer film 114 having a single layer or multilayer structure is formed by depositing an inorganic insulation material such as $SiO_x$ or $SiN_x$ over the entire surface of the substrate 101 provided with the light-shielding layer 102. In one embodiment, an amorphous silicon thin film is formed on the substrate 101 provided with the buffer film 114 by a method such as low pressure chemical vapor deposition (LPCVD) or plasma enhanced chemical vapor deposition (PECVD). Then, the amorphous silicon thin film is crystallized into a poly-silicon thin film. In addition, the poly-silicon thin film is patterned by photolithography and etching processes to form first and second active layers 154 and 104. In other embodiments, when the first and second active layers 154 and 104 are formed of oxide semiconductor material, an oxide semiconductor film may be formed on the substrate 101, and etched to form the first and second active layers 154 and 104.

Figure 4C:
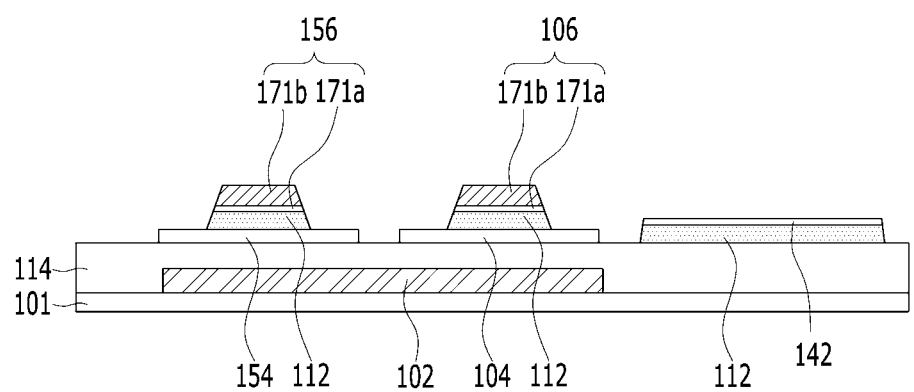
Figure 4C:
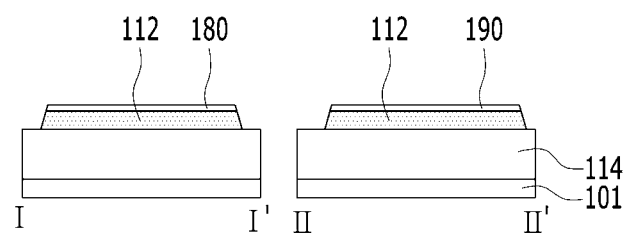

Referring to FIG. 4C, first and second gate electrodes 156 and 106, a lower storage electrode 142, first and second jumping lines 180 and 190, and a gate insulation pattern 112 are formed on the substrate 101 provided with the first and second active layers 154 and 104. In one embodiment, these layers may be formed in the same line width on the substrate 101.

More specifically, a gate insulation film is formed on the substrate 101 provided with the first and second active layers 154 and 104, and a first transparent conductive layer 171a and a first opaque conductive layer 171b are sequentially formed thereon by a deposition method such as sputtering. The gate insulation film is formed using an inorganic insulation material such as $SiO_x$ or $SiN_x$. The first transparent conductive layer 171a is formed using a transparent conductive material such as ITO. The first opaque conductive layer 171b is formed as a single layer using a metal material such as Mo, Ti, Cu, AlNd, Al or Cr, or an alloy thereof, or as multiple layers using the same. Then, a multi-step photoresist pattern is formed by a photolithographic process using a half-tone mask. Through an etching process using this multi-step photoresist pattern as a mask, the first transparent conductive layer 171a, the first opaque conductive layer 171b and the gate insulation film are simultaneously patterned to form the first and second gate electrodes 156 and 106, the lower storage electrode 142, the first and second jumping lines 180 and 190, and the gate insulation pattern 112 in the same pattern. In this case, each of the first and second gate electrodes 156 and 106, the lower storage electrode 142, and the first and second jumping lines 180 and 190 is formed by sequentially stacking the first transparent conductive layer 171a and the first opaque conductive layer 171b on the first transparent conductive layer 171a.

Then, the photoresist pattern with a multi-step structure is ashed to expose the first opaque conductive layer 171b of each of the lower storage electrode 142, and the first and second jumping lines 180 and 190. The exposed first opaque conductive layer 171b of the lower storage electrode 142, and the exposed first and second jumping lines 180 and 190 are removed by an etching process using the ashed photoresist pattern as a mask, thereby forming the lower storage electrode 142, and the first and second jumping lines 180 and 190 with the first transparent conductive layer 171a.

Figure 4D:
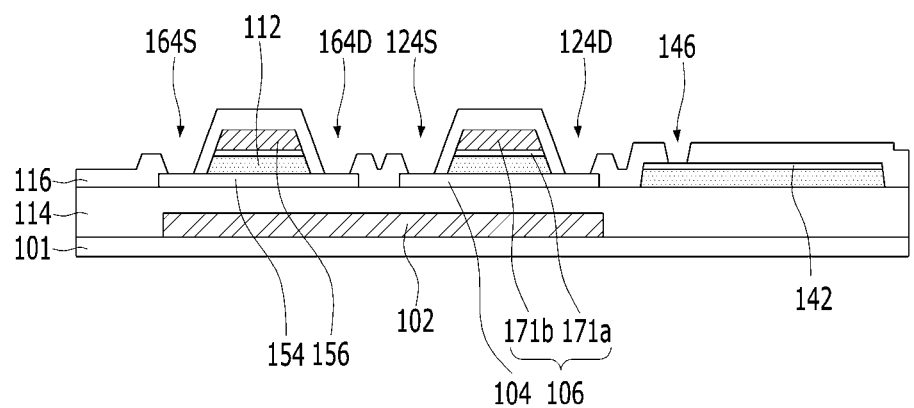
Figure 4D:
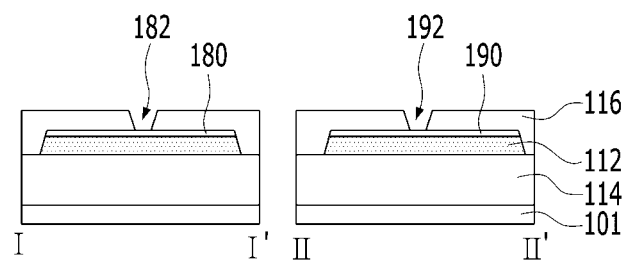

Referring to FIG. 4D, an interlayer insulation film 116 including first and second source contact holes 164S and 124S, first and second drain contact holes 164D and 124D, first and second power contact holes 182 and 192, and a storage contact hole 146 is formed on the substrate 101 provided with the first and second gate electrodes 156 and 106, the lower storage electrode 142, and the first and second jumping lines 180 and 190.

More specifically, the interlayer insulation film 116 is formed by a deposition method such as PECVD on the substrate 101 provided with the first and second gate electrodes 156 and 106, the lower storage electrode 142, and the first and second jumping lines 180 and 190. Then, the interlayer insulation film 116 is patterned by a photolithographic process and an etching process, to form the first and second source contact holes 164S and 124S, the first and second drain contact holes 164D and 124D, the first and second power contact holes 182 and 192, and the storage contact hole 146.

Figure 4E:
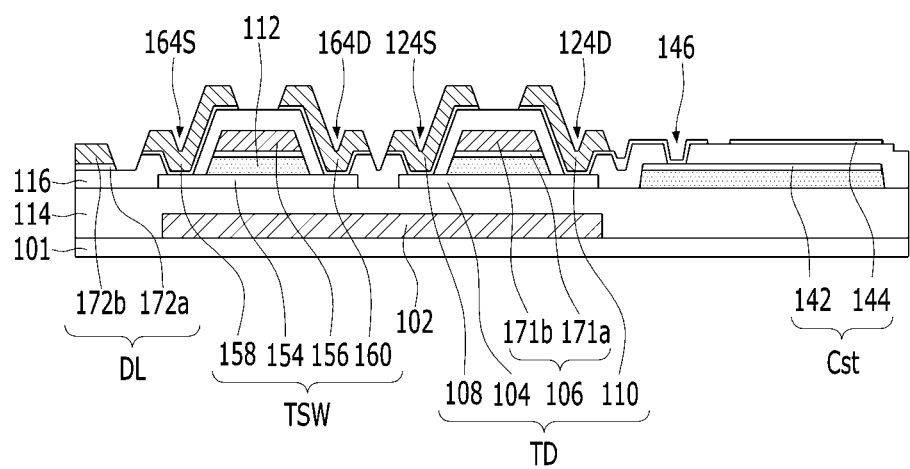
Figure 4E:
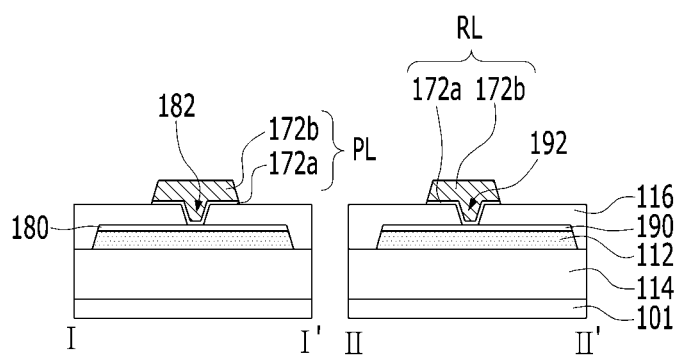

Referring to FIG. 4E, first and second source electrodes 158 and 108, first and second drain electrodes 160 and 110, an upper storage electrode 144, a power supply line PL, and a reference line RL are formed on the interlayer insulation film 116 provided with the first and second source contact holes 164S and 124S, the first and second drain contact holes 164D and 124D, the first and second power contact holes 182 and 192, and the storage contact hole 146. In other words, a first electrode of a first transistor may be formed, where the first electrode includes a first conductive layer (e.g., 172a) formed of transparent conductive material, and a second conductive layer (e.g., 172b) that contacts a first portion of the first conductive layer.

More specifically, a second transparent conductive layer 172a and a second opaque conductive layer 172b are sequentially deposited by a deposition method such as sputtering on the interlayer insulation film 116 provided with the first and second source contact holes 164S and 124S, the first and second drain contact holes 164D and 124D, the first and second power contact holes 180 and 190, and the storage contact hole 146. The second transparent conductive layer 172a is formed using a transparent conductive material such as ITO. The second opaque conductive layer 172b is formed as a single layer using a metal such as Mo, Ti, Cu, AlNd, Al, Cr or an alloy thereof, or as multiple layers using the same. Then, a multi-step photoresist pattern is formed by a photolithographic process using a half-tone mask. Through an etching process using this multiple-step photoresist pattern as a mask, the second transparent conductive layer 172a and the second opaque conductive layer 172b are simultaneously patterned to form first and second source electrodes 158 and 108, first and second drain electrodes 160 and 110, an upper storage electrode 144, a power supply line PL, and a reference line RL. In this case, the first and second source electrodes 158 and 108, the first and second drain electrodes 160 and 110, the upper storage electrode 144, the power supply line PL, and the reference line RL are formed by sequentially stacking the second transparent conductive layer 172a and the second opaque conductive layer 172b. Then, the photoresist pattern with a multi-step structure is ashed to expose the second opaque conductive layer 172b of the storage upper electrode 144 and a region of the second drain electrode 110 overlapping the lower storage electrode 142. The exposed upper storage electrode 144 and the first opaque conductive layer 171b of the region of the second drain electrode 110 overlapping the lower storage electrode 142 are removed by an etching process using the ashed photoresist pattern as a mask. Thus, a part of the second opaque conductive layer 172b is etched to expose the second portion of the second transparent conductive layer 172a. As a result, each of the region of the second drain electrode 110 overlapping the lower storage electrode 142 and the upper storage electrode 144 is formed as the second transparent conductive layer 172a. In one embodiment, the second portion of the second transparent conductive layer 172a may contact the lower storage electrode 142 of the storage capacitor Cst disposed below the interlayer insulation film 116. In another embodiment, the second portion of the second transparent conductive layer 172a may contact a conductive layer extending from a part of the gate electrode 106 of the driving transistor TD.

Figure 4F:
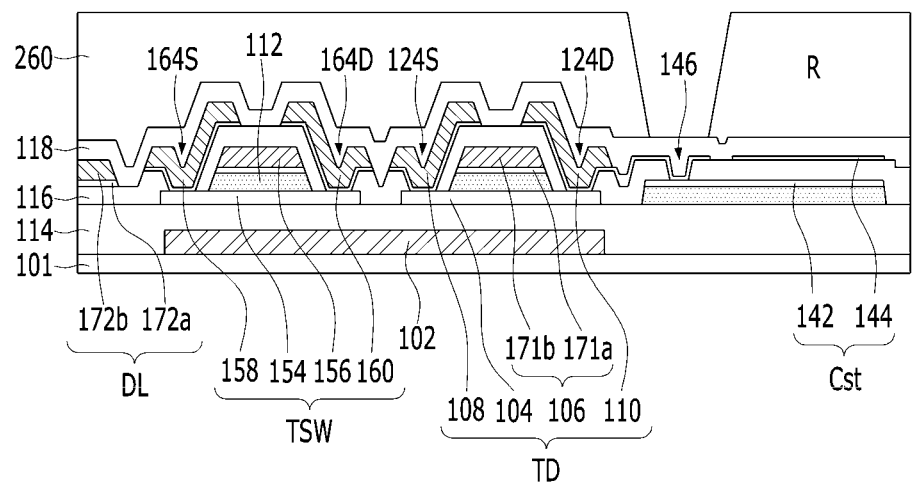
Figure 4F:
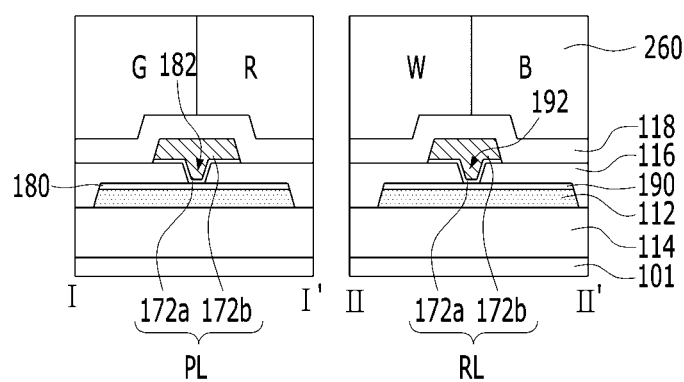

Referring to FIG. 4F, a protective film 118 is formed on the interlayer insulation film 116 provided with the first and second source electrodes 158 and 108, the first and second drain electrodes 160 and 110, the upper storage electrode 144, the power supply line PL, and the reference line RL, and a color filter 260 is formed on the protective film 118. In one embodiment, the protective film 118 contacts the second opaque conductive layer 172b and the second portion of the second transparent conductive layer 172a that does not contact the second opaque conductive layer 172b. The color filter is formed to overlap the emission area and to cover at least one of the switching thin film transistor TSW and the driving thin film transistor TD.

More specifically, the protective film 118 is formed on the interlayer insulation film 116 provided with the first and second source electrodes 158 and 108, the first and second drain electrodes 160 and 110, the upper storage electrode 144, the power supply line PL, and the reference line RL. The protective film 118 is formed using an inorganic insulation material such as $SiO_x$ or $SiN_x$. Then, a color resin is applied and then patterned by a photolithographic process to form a color filter 260.

Figure 4G:
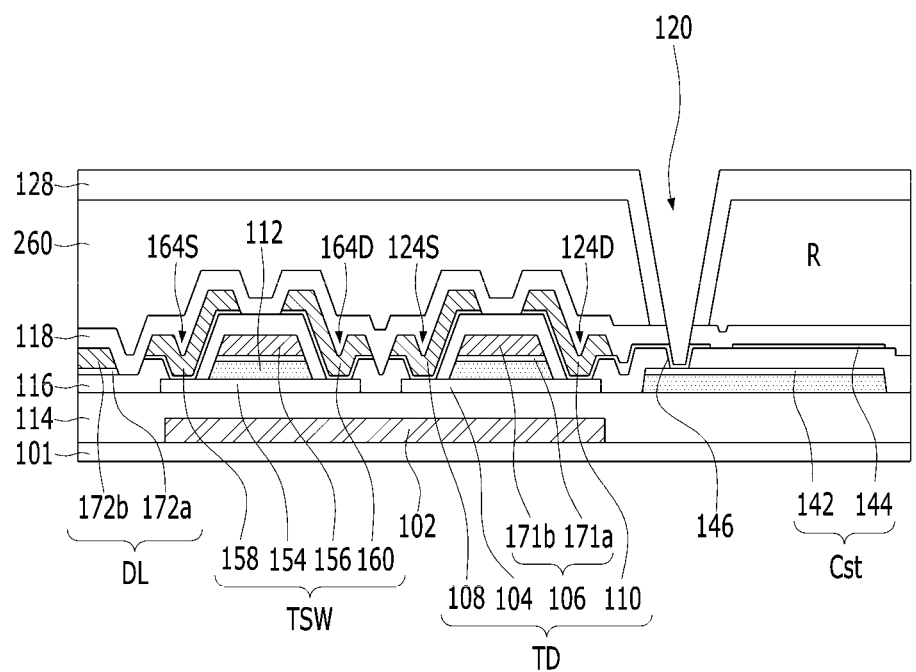
Figure 4G:
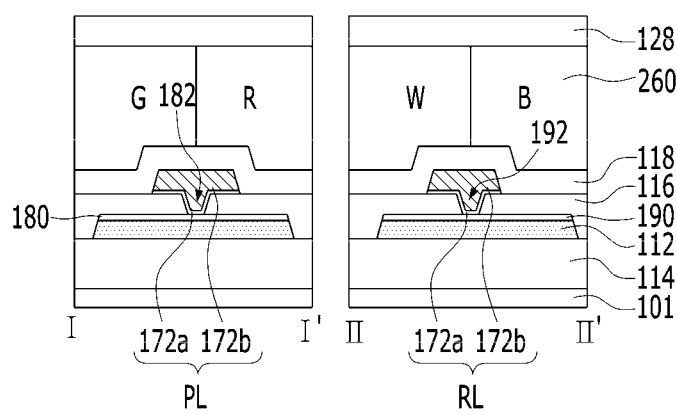

Referring to FIG. 4G, a planarization layer 128 having a pixel contact hole 120 is formed on the substrate 101 provided with the color filter 260.

More specifically, the planarization layer 128 is formed by applying an organic film such as a photoacrylic resin over the entire surface of the substrate 101 provided with the color filter 260. Then, the planarization layer 128 is patterned by a photolithographic process to form a pixel contact hole 120.

Figure 4H:
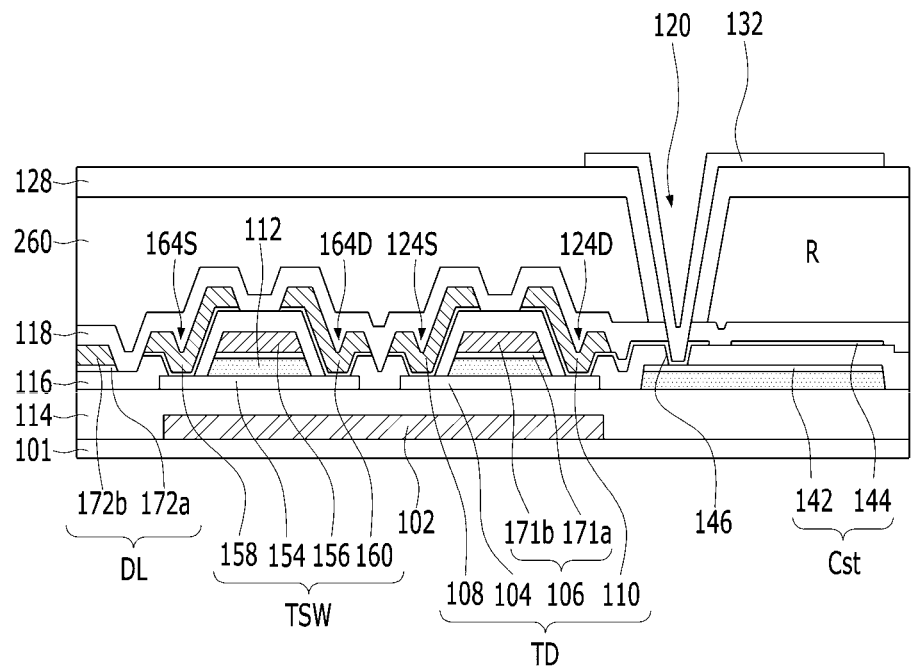
Figure 4H:
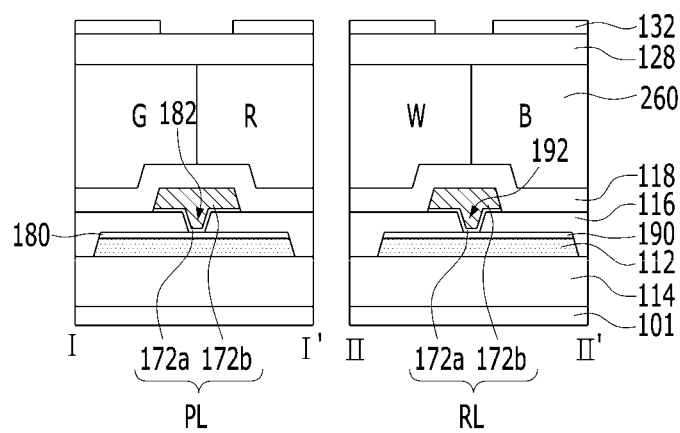

Referring to FIG. 4H, an anode 132 is formed on the planarization layer 128 having the pixel contact hole 120.

More specifically, a transparent conductive layer is stacked on the planarization layer 128 having the pixel contact hole 120. Then, the transparent conductive layer is patterned by a photolithographic process and an etching process to form an anode 132.

Figure 4I:
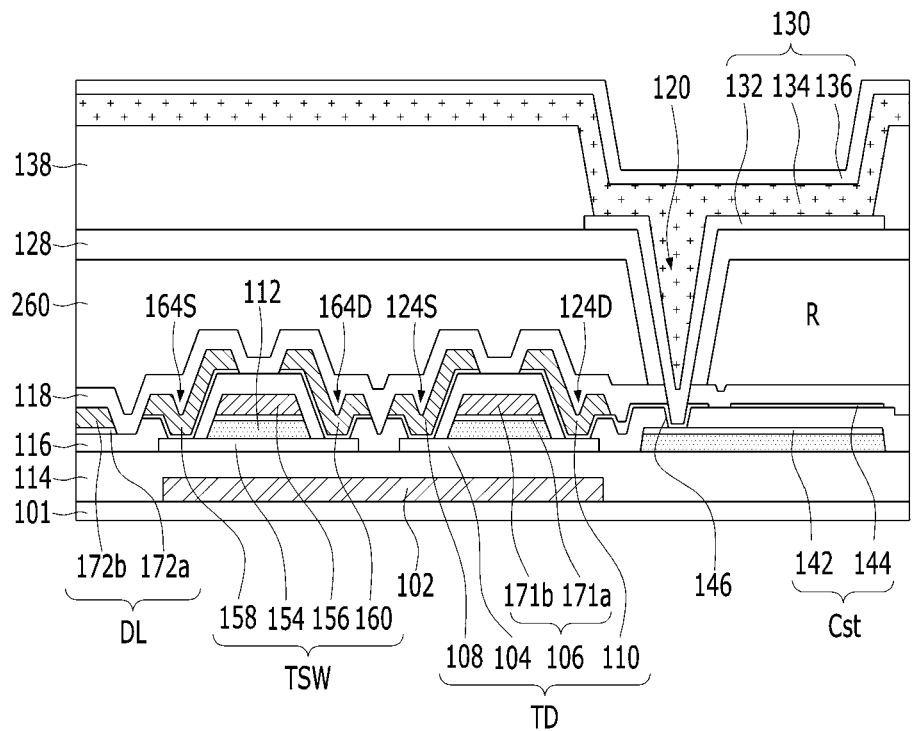
Figure 4I:
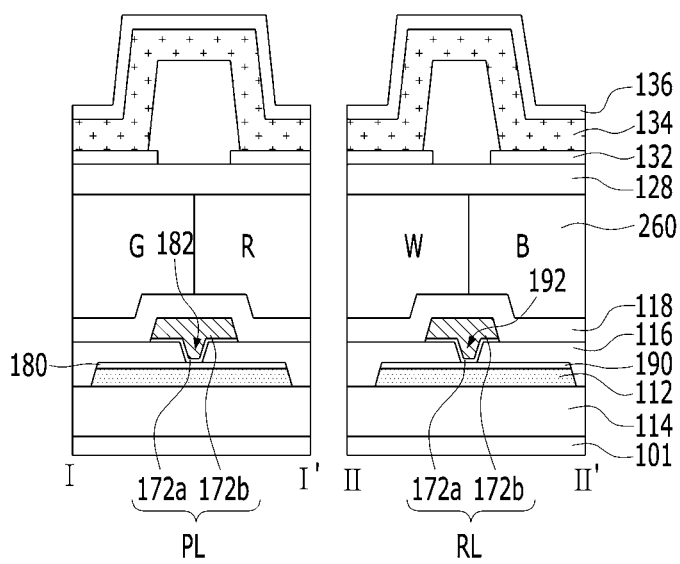

Referring to FIG. 4I, a bank 138, an organic light emitting layer 134, and a cathode 136 are sequentially formed on the substrate 101 provided with the anode 132.

More specifically, an organic film such as a photoacrylic resin is applied over the entire surface of the substrate 101 provided with the anode 132. Then, the organic film is patterned by a photolithographic process to form the bank 138. Then, an organic light emitting layer 134 rendering white is applied over the entire surface of the substrate 101 provided with the bank 138, and a cathode 136 is formed on the substrate 101 provided with the organic light emitting layer 134. A second portion of the first conductive layer 172a of the first drain electrode 160 or the second drain electrode 110 that does not contact the second conductive layer 172b may be disposed below the light emitting element 130.

As such, according to the present disclosure, at least one of a region where the storage contact hole 146 is formed, and regions where the first and second jumping lines 180 and 190 are formed becomes transparent. As a result, the present disclosure facilitates high-resolution based on improved aperture ratio, because a light emitting region where the anode 132 is disposed as well as transparent regions can be used as light emitting regions.

Meanwhile, although the present disclosure suggests, as an example, the case where the first and second jumping lines 180 and 190 are simultaneously formed with the same mask process as the first and second gate electrodes 156 and 106, the first and second jumping lines 180 and 190 may be formed by the same mask process as in the light-shielding layer 102, or the first jumping line 180 may be formed by extending the second transparent conductive layer 172a of the power supply line PL into a light emitting region without the first power contact hole 182, or the second jumping line 190 may be formed by extending the second transparent conductive layer 172a of the reference line RL into a light emitting region without the second power contact hole 192.

As apparent from the foregoing, in accordance with the present disclosure, at least one of a region where the storage contact hole 146 is formed, and regions where the first and second jumping lines 180 and 190 are formed becomes transparent. As a result, the present disclosure can facilitate high-resolution based on improved aperture ratio because a light emitting region where the anode 132 is disposed as well as transparent regions can be used as light emitting regions.

In addition, it will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents. For example, respective components specifically shown in the embodiments can be implemented in modified forms.

What is claimed is:

1. A display device, comprising:
  a transparent substrate;
  a conductive line on the substrate, the conductive line including at least one of a reference line or a power line;
  a jumping line on the substrate electrically connected to the conductive line wherein the jumping line is formed of transparent conductive material, and
  a plurality of sub pixels on the substrate, each sub pixel comprising:
    a light emitting element on the substrate; and
    a first thin film transistor (TFT) on the substrate, the first TFT including an active layer and a first electrode electrically connected to the active layer, wherein the first electrode includes:
      a first conductive layer formed of transparent conductive material, the first conductive layer including a first portion and a second portion, and
      a second conductive layer contacting the first portion of the first conductive layer,
    a sensing transistor electrically connected to the light emitting element on the substrate;
  wherein the second portion of the first conductive layer is disposed below the light emitting element, and does not contact the second conductive layer,
  wherein the jumping line protrudes from the reference line towards each sub-pixel region of the plurality of sub pixels parallel to a scan line to connect the reference line to the sensing transistor, or the jumping line protrudes from the power line toward each sub-pixel region parallel to a scan line to connect the power line to the first TFT.

2. The display device of claim 1, wherein the pixel further comprises an insulating layer on the first electrode, wherein the insulating layer contacts a top surface of the second conductive layer, and contacts a top surface of the second portion of the first conductive layer.

3. The display device of claim 1, wherein the pixel further comprises an insulating layer on the substrate formed with an opening, and wherein the second portion of the first conductive layer is disposed in the opening.

4. The display device of claim 3, wherein the light emitting element includes an anode electrode, and the anode electrode contacts the second portion of the first conductive layer.

5. The display device of claim 3, wherein the pixel further comprises a third conductive layer below the insulating layer, wherein the third conductive layer is formed of transparent conductive material, and wherein the second portion of the first conductive layer contacts a portion of the third conductive layer exposed through the opening.

6. The display device of claim 5, wherein the pixel further comprises a storage capacitor below the light emitting element, and wherein the third conductive layer is a lower storage electrode of the storage capacitor.

7. The display device of claim 5, wherein the pixel further comprises a driving TFT for driving the light emitting element, and wherein the third conductive layer extends from at least a part of a gate electrode of the driving transistor.

8. The display device of claim 1, wherein the second conductive layer is formed of opaque metal.

9. The display device of claim 1, wherein the conductive line extends in a first direction, and
  wherein the jumping line extends in a second direction different from the first direction.

10. The display device of claim 9, wherein a portion of the jumping line is disposed below the light emitting element.

11. The display device of claim 9, wherein the conductive line is a power line and the first TFT is a driving transistor for driving the light emitting element, and wherein the jumping line is electrically connected to the first TFT.

12. The display device of claim 9, wherein the first TFT includes a gate electrode, and the jumping line is formed in a same layer as a part of the gate electrode.

13. A method of manufacturing a display device, comprising:
  forming an active layer of a first thin film transistor (TFT) on a substrate;
  forming a conductive line on the substrate, the conductive line including at least one of a reference line or a power line;
  forming a jumping line on the substrate electrically connected to the conductive line, wherein the jumping line is formed of transparent conductive material, forming a first conductive layer of a first electrode of the first TFT electrically connected to the active layer, wherein the first electrode includes a first conductive layer formed of transparent conductive material, and includes a second conductive layer that contacts a first portion of the first conductive layer; and forming a light emitting element electrically connected to a sensing transistor on the substrate, wherein a second portion of the first conductive layer is disposed below the light emitting element, and does not contact the second conductive layer, wherein the jumping line protrudes from the reference line toward each sub-pixel region of the plurality of sub pixels parallel to a scan line to connect the reference line to the sensing transistor, or the jumping line protrudes from the power line toward each sub-pixel region parallel to a scan line to connect the power line to the first TFT.

14. The method of claim 13, wherein forming the first electrode further comprises:
depositing a first conductive pattern formed of the transparent conductive material on the substrate;
depositing a second conductive pattern on the first conductive pattern;
patterning the first conductive pattern and the second conductive pattern to form the first conductive layer and a third conductive pattern on the first conductive layer; and
etching a part of the third conductive pattern to form the second conductive layer and expose the second portion of the first conductive layer.

15. The method of claim 13, further comprising forming an insulating layer on the first electrode, wherein the insulating layer contacts a top surface of the second conductive layer, and contacts a top surface of the second portion of the first conductive layer.

16. The method of claim 13, further comprising:
forming an insulating layer on the substrate; and
forming an opening in the insulating layer, wherein the second portion of the first conductive layer is disposed in the opening.

17. The method of claim 16, wherein the light emitting element includes an anode electrode, and the anode electrode contacts the second portion of the first conductive layer.

18. The method of claim 13, wherein the conductive line extends in a first direction, and
wherein the jumping line extends in a second direction different from the first direction.

19. The method of claim 18, wherein a portion of the jumping line is disposed below the light emitting element.

20. A display device, comprising:
a transparent substrate;
a conductive line on the substrate;
a jumping line on the substrate electrically connected to the conductive line wherein the jumping line is formed of transparent conductive material, and
a plurality of sub pixels on the substrate, each sub pixel comprising:
a light emitting element on the substrate; and
a first thin film transistor (TFT) on the substrate, the first TFT including an active layer and a first electrode electrically connected to the active layer, wherein the first electrode includes:
a first conductive layer formed of transparent conductive material, the first conductive layer including a first portion and a second portion, and
a second conductive layer contacting the first portion of the first conductive layer,
a sensing transistor electrically connected to the light emitting element on the substrate;
wherein the second portion of the first conductive layer is disposed below the light emitting element, and does not contact the second conductive layer,
wherein the conductive line is a reference line electrically connected to the sensing transistor, and wherein the jumping line is electrically connected to the sensing transistor.

* * * * *